(12) United States Patent
Bregante et al.

(10) Patent No.: US 10,705,548 B2
(45) Date of Patent: Jul. 7, 2020

(54) AIR CAVITY PACKAGE WITH SUPPLEMENTAL HEAT GENERATOR

(71) Applicant: RJR Technologies, Inc., Oakland, CA (US)

(72) Inventors: Raymond S. Bregante, Oakland, CA (US); Alex Elliott, Phoenix, AZ (US)

(73) Assignee: RJR Technologies, Inc., Oakland, CA (US)

( * ) Notice: Subject to any disclaimer, the term of this patent is extended or adjusted under 35 U.S.C. 154(b) by 0 days.

(21) Appl. No.: 16/089,034

(22) PCT Filed: Feb. 23, 2018

(86) PCT No.: PCT/IB2018/051150
§ 371 (c)(1),
(2) Date: Sep. 27, 2018

(87) PCT Pub. No.: WO2018/154510
PCT Pub. Date: Aug. 30, 2018

(65) Prior Publication Data
US 2019/0377373 A1    Dec. 12, 2019

(51) Int. Cl.
*G05D 22/02* (2006.01)
*B65D 81/18* (2006.01)
*H05B 3/64* (2006.01)

(52) U.S. Cl.
CPC ............. *G05D 22/02* (2013.01); *B65D 81/18* (2013.01); *H05B 3/64* (2013.01)

(58) Field of Classification Search
CPC ........... H05B 3/64; B65D 81/18; H01L 29/84;
H01L 29/6607; H01L 23/047; H01L 23/49861; H01L 23/10; H01L 2924/0002; H01L 2924/19107; H01L 2924/001; H01L 2924/01322; H01L 2924/00014; H01L 2224/16225; H01L 2224/32225; H01L 2224/32245; H01L 2224/73204; H01L 2224/73253; H01L 2224/0104; B81C 1/0029; B81C 2203/035;
(Continued)

(56) References Cited

U.S. PATENT DOCUMENTS 5,256,382 A   10/1993   Ford et al.
6,054,755 A   4/2000   Takamichi et al.
(Continued)

OTHER PUBLICATIONS

Aug. 27, 2019, PCT International Preliminary Report on Patentability for International Application No. PCT/IB2018/051150.
(Continued)

*Primary Examiner* — Shawntina T Fuqua
(74) *Attorney, Agent, or Firm* — Law Offices of Damon L. Boyd, PLLC

(57) ABSTRACT

An air cavity package having a supplemental heat generator for generating heat and a pressure greater than atmospheric pressure within the air cavity package. The supplemental heat generator may be maintained at a constant or variable temperature. The supplemental heat generator may be selectively activated based on a predetermined parameter by a user or by a processor. The supplemental heat generator may be an RF and or other chip capable of generating heat or a conductive wire.

12 Claims, 3 Drawing Sheets

(58) Field of Classification Search
CPC ...... B81C 2203/0109; B81C 2203/032; B81B 2201/0235; B81B 2201/0242
See application file for complete search history.

(56) References Cited

U.S. PATENT DOCUMENTS

| | | | |
|---|---|---|---|
| 6,773,964 B2* | 8/2004 | Fan | H01L 23/10 257/706 |
| 2012/0170221 A1 | 7/2012 | Mok | |
| 2013/0093031 A1* | 4/2013 | Gao | H01L 29/66007 257/417 |
| 2014/0103518 A1 | 4/2014 | Fu et al. | |

OTHER PUBLICATIONS

Sep. 6, 2019, PCT Notification Concerning Transmittal of International Preliminary Report on Patentability for International Application No. PCT/IB2018/051150.

* cited by examiner

AIR CAVITY PACKAGE WITH SUPPLEMENTAL HEAT GENERATOR

FIELD

The present disclosure relates generally to electronic air cavity packages with structure and mechanisms that aid expelling moisture from therein and prevent moisture from entering therein.

BACKGROUND

Electronic devices are ubiquitous in consumer and commercial products and devices throughout the world. Many include circuitry which are often comprised of materials such as silicon, gallium arsenide, and other similar "semiconductor" materials, and are commonly referred to in industry as "dies." Any given die may be capable of containing a multitude of circuit elements for performing various functions. In use, these dies are often incorporated into packages known as air cavity packages (ACPs) generally comprised with a housing surrounding a volume for containing the dies and various electrical components that provide a variety of functions. These air cavity packages can be classified as fully, near, or non-hermetic.

One benefit of some conventional ACP's, particularly RF packages, is that they have dies that generate heat when they are under power, which helps prevent moisture from entering the package, for example, by creating a pressure differential (e.g., an internal pressure above atmospheric pressure or about 15 psi) which drives moisture out. The presence of moisture in an ACP is detrimental as it can impact performance and lead to corrosion and failure of the package and its components.

However, for some packages, particularly those that are known as "deep packages" including communication-related and/or those used for data storage, which often use lasers to transmit data, insufficient heat is generated during use to aid in preventing moisture from entering the package and/or driving moisture out.

As such, there is a need for apparatus, systems, and methods that prevent moisture from entering packages and/or drive moisture out, preferably in a cost-effective manner.

SUMMARY

In accordance with various aspects of the present disclosure, an air cavity package having a supplemental heat generator for generating heat and a pressure greater than atmospheric pressure within the air cavity package is provided. The supplemental heat generator may be maintained at a constant or variable temperature. The supplemental heat generator may be selectively activated based on a predetermined parameter by a user or by a processor. The supplemental heat generator may be an RF and or other chip capable of generating heat or a conductive wire.

BRIEF DESCRIPTION OF THE DRAWINGS

The accompanying drawings are included to provide a further understanding of the disclosure and are incorporated in and constitute a part of this specification, illustrate embodiments of the disclosure, and together with the description serve to explain the principles of the disclosure, wherein like numerals denote like elements and wherein.

DETAILED DESCRIPTION OF THE ILLUSTRATED EMBODIMENTS

Figure 1:
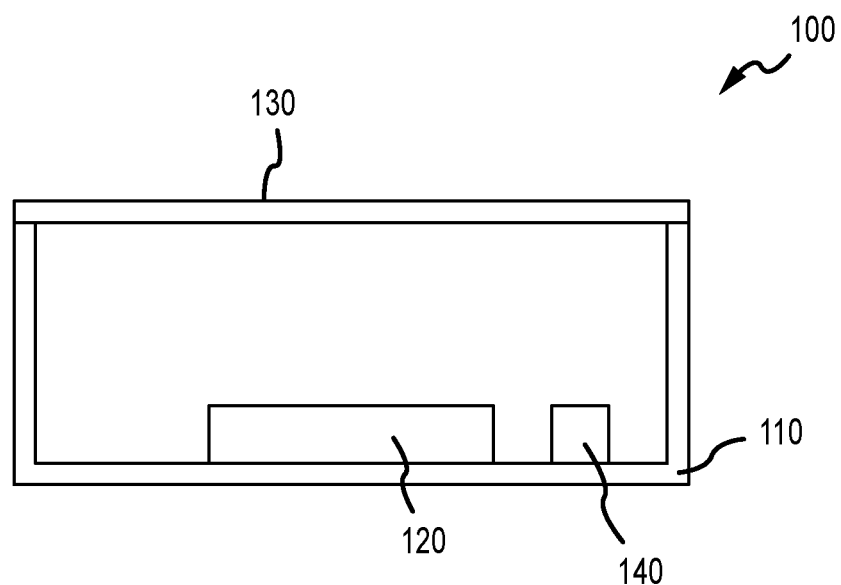
FIG. 1 is an air cavity package with a supplemental heat generator therein.

Persons skilled in the art will readily appreciate that various aspects of the present disclosure can be realized by any number of structures, components, and systems configured to perform various functions disclosed herein. Stated differently, other such structures, components, and systems can be incorporated herein to perform the intended functions. It should also be noted that the accompanying drawing figures referred to herein are not all necessarily drawn to scale and may be exaggerated to illustrate various aspects of the present disclosure, and in that regard, the drawing figures should not be construed as limiting.

As noted above, the presence of moisture in air cavity packages is detrimental as it can impact performance and lead to failure of the package and its components. As also noted, many conventional packages, particularly RF packages, have dies that generate heat when under power, which helps prevent moisture from entering the package, for example, by creating a pressure differential which drives moisture out. However, packages that do not have components that themselves generate sufficient heat and/or when the package is not under power so there is no heat source to prevent moisture from entering the package and/or driving moisture out, need alternative mechanisms for doing the same.

Thus, in accordance with various aspects of the present disclosure, additional heat generating components can be included in packages. The heat generating components can be held at a substantially constant temperature or can be activated to generate heat, thereby creating a corresponding pressure differential to drive moisture out of the package and/or to prevent moisture from entering the package. The ability to generate heat inside the package can be accomplished numerous ways, such as during assembly of a hermetic package and/or after the assembly of packages that are not entirely hermetically sealed.

For example, with reference to FIG. 1, an exemplary package 100 is illustrated. Though a variety of components now known or as yet unknown in the art may be included as part of a package and fall within the scope of the present invention, the package 100 generally comprises a housing 110 with a space therein for operational components 120 such as dies, sensors, leads, and a wide variety of components that contribute to the operational functionality of the package. The housing 110 may have one or more openings that are sealed with another component, such as a lid 130. Any number of known or as yet unknown adhesives (e.g., epoxies) may be used for attaching the lid 130 to the housing 110. The seal between the housing 110 and the lid 130 may be hermetic, "near hermetic," or non-hermetic depending on the requirements of the application for the package 100.

In order to generate or add supplemental heat within the package to address the moisture concerns noted above, a supplemental heat generator 140 may be included with the package 100. When the heat generator 140 is activated, it generates heat which can help maintain moisture in a vapor state and, by creating a pressure differential, prevents moisture from entering the package 100 during assembly or after assembly (e.g., when the package is not hermetically sealed) by preventing moisture ingress back into the package 100.

In various embodiments, the heat generator 140 may be any component capable of generating heat sufficient for driving moisture out of the package 100 and preventing moisture ingress back into the package 100. In various embodiments, the heat generator 140 can be on at all times, or can be selectively activated by a user or a processor that automatically activates the heat generator 140 based on certain pre-determined parameters and/or programming, such as sensing a pre-determined moisture level, or when a hermetic package is in an active mode so the heat generator 140 activates to heat the interior cavity.

Figure 2:
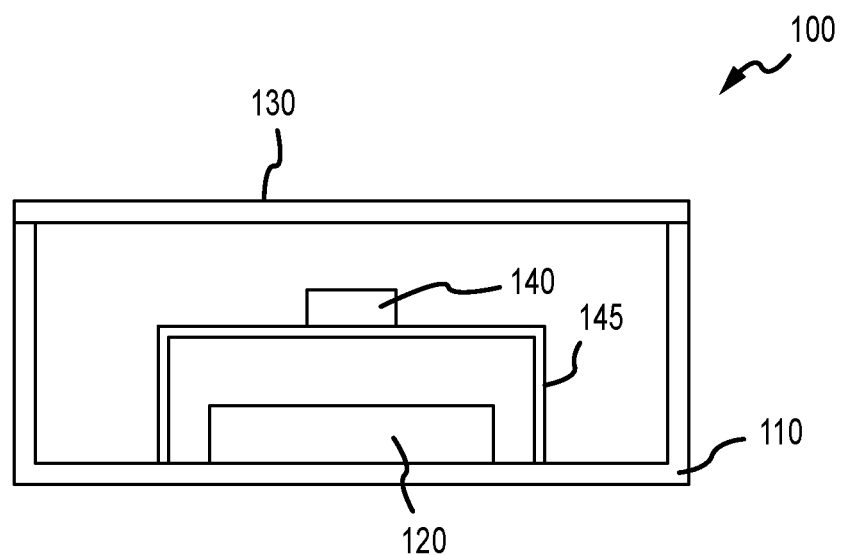
FIG. 2 is an air cavity package with a supplemental heat generator therein on a pedestal.

In various embodiments, the heat generator 140 may be a conductor such as a conductive wire configured such that when current passes through it, heat is generated inside the package 100. Alternatively, the heat generator 140 may be an RF or any other chip that can be selectively energized to heat the interior of the package 100 and drive the moisture out of the package. In various embodiments, with reference to FIG. 2, the heat generator 140 may be elevated, for example, on a pedestal 145 so that it is positioned towards a central region of the package 100 to aid in heat distribution. As those skilled in the art will appreciate, any component that can supplement heat within a package 100 is contemplated within the scope of the present disclosure and not limited to the foregoing examples.

As noted above, in accordance with some embodiments, the heat generator 140 may always be active or turned on and off as required. Such embodiments may be preferable when used with near hermetic packages, as it may take a relatively significant amount of time for moisture to escape from the package 100. In some embodiments, by maintaining a substantially constant power to the heat generator 140 (which may be a relatively "low power" setting to generate just enough heat to drive off moisture), an elevated temperature and internal pressure may be maintained and moisture may be constantly prevented from entering the package 100. Additionally, substantially constant temperatures may be maintained. In other embodiments, as noted above, the heat generator 140 can be selectively activated by a user or a processor that automatically activates the heat generator 140 based on certain pre-determined programming and/or parameters, such as sensing a pre-determined moisture level, or when a laser is in an active mode so the heat generator 140 activates to heat the interior cavity.

In various embodiments, by maintaining the package 100 as dry as possible during assembly, for example, by "pre-baking" the package 100 or otherwise heating it during assembly, when used in combination with a heat generator 140 that is always active, the inside of the package 100 is easier to maintain as moisture free. For example, by storing the package in vacuum packs with a desiccant and/or by using a prebake before assembly, and then vacuum packing the assembled packages until they are used, when the first time the heat generator 140 is activated, any minimal moisture present can be driven out.

In various embodiments, using a two-way "moisture getter" material such as RJR Technologies, Inc.'s in-out moister getter material, which absorbs moisture as it comes into the package and when subsequently subjected to heat, the moisture is driven out into the air cavity, which then will be driven out of the package that is sealed with an epoxy.

Figure 3:
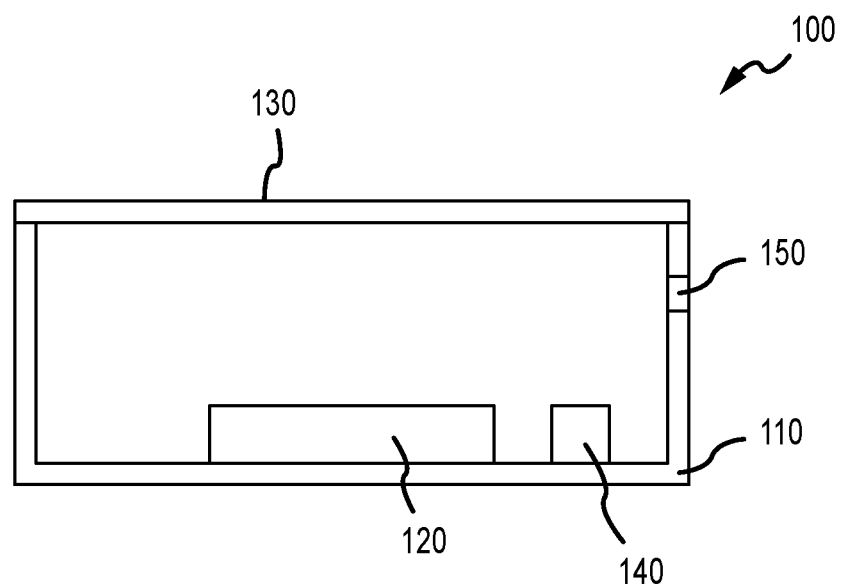
FIG. 3 is an air cavity package with a supplemental heat generator therein and a hole and valve in the air cavity package for allowing air and moisture to escape.

In alternative embodiments and with reference to FIG. 3, the housing 110, lid 130 or other wall of the package 100 may have a hole 150 to facilitate evacuating moisture from the package 100. The hole 150 may be configured such that it can be opened and closed, for example, by a one-way valve which allows air and moisture to escape but not enter the package 100. In such embodiments, heat from the heat generator 140 heats up the package 100 and as the pressure rises the valve opens and air and moisture is driven out. In some embodiments, the seal may be closed with a spring-loaded metal ball, though other valves with similar functions, namely to allow moisture to pass out of the package 100, but prevent ingress of moisture into the package, may be used.

Finally, the foregoing description emphasizes particular embodiments and examples of the contemplated disclosure. However, as those skilled in the art will recognize, however, the scope of the present disclosure extends as well to variations and modifications of the above, in terms of materials, operating conditions, operating procedures, and other parameters and their components and of procedures for their assembly.

Likewise, numerous characteristics and advantages have been set forth in the preceding description, including various alternatives together with details of the structure and function of the methods and systems described herein. The disclosure is intended as illustrative only and as such is not intended to be exhaustive. It will be evident to those skilled in the art that various modifications may be made, especially in matters of order, process, structure, elements, components, and arrangement including combinations of the same within the principles of the disclosure, to the full extent indicated by the broad, general meaning of the terms in which the appended claims are expressed. To the extent that these various modifications do not depart from the spirit and scope of the appended claims, they are intended to be encompassed therein.

We claim:

1. An air cavity package comprising a supplemental heat generator for generating heat and a pressure greater than atmospheric pressure within the air cavity package, wherein the supplemental heat generator is selectively activated based on a predetermined parameter by at least one of a user and a processor.

2. An air cavity package in accordance with claim 1, wherein the supplemental heat generator is maintained at a constant temperature.

3. An air cavity package in accordance with claim 1, wherein the pre-determined parameter comprises a moisture level.

4. An air cavity package in accordance with claim 1, wherein the supplemental heat generator is at least one of an RF and chip capable of generating heat.

5. An air cavity package in accordance with claim 1, wherein the supplemental heat generator is a conductive wire.

6. An air cavity package in accordance with claim 1, wherein the air cavity package comprises a housing and a lid and a hole in at least one of the housing and the lid.

7. An air cavity package in accordance with claim 6, wherein the hole is sealed by a one-way valve.

8. An air cavity package comprising a supplemental heat generator for generating heat and a pressure greater than atmospheric pressure within the air cavity package, wherein the supplemental heat generator is maintained at a constant temperature.

9. An air cavity package in accordance with claim 8, wherein the supplemental heat generator is at least one of an RF and chip capable of generating heat.

10. An air cavity package in accordance with claim 8, wherein the supplemental heat generator is a conductive wire.

11. An air cavity package in accordance with claim 8, wherein the air cavity package comprises a housing and a lid and a hole in at least one of the housing and the lid.

12. An air cavity package in accordance with claim 11, wherein the hole is sealed by a one-way valve.

* * * * *